United States Patent
Fry

(10) Patent No.: US 6,362,700 B1
(45) Date of Patent: Mar. 26, 2002

(54) TEMPERATURE CONTROLLED COMPENSATED OSCILLATOR

(75) Inventor: Steven J. Fry, Carlisle, PA (US)

(73) Assignee: CTS Corporation, Elkhardt, IN (US)

( * ) Notice: Subject to any disclaimer, the term of this patent is extended or adjusted under 35 U.S.C. 154(b) by 0 days.

(21) Appl. No.: 09/670,477

(22) Filed: Sep. 26, 2000

Related U.S. Application Data

(63) Continuation-in-part of application No. 09/335,245, filed on Jun. 17, 1999, which is a continuation-in-part of application No. 08/961,689, filed on Oct. 31, 1997, now abandoned.

(51) Int. Cl.[7] .............................. H03B 5/32; H03L 1/04

(52) U.S. Cl. .......................... 331/176; 331/158; 331/69

(58) Field of Search ................................. 331/176, 158, 331/69

(56) References Cited

U.S. PATENT DOCUMENTS

| | | | |
|---|---|---|---|
| 4,479,096 A | * 10/1984 | Fowks | 331/3 |
| 4,893,097 A | * 1/1990 | Zwack | 331/176 |
| 5,041,799 A | 8/1991 | Pirez | 331/44 |
| 5,180,942 A | * 1/1993 | Marvin et al. | 331/69 X |
| 5,729,181 A | * 3/1998 | Cutler et al. | 331/69 |
| 5,781,075 A | 7/1998 | Bolton | 331/176 |
| 6,166,608 A | * 12/2000 | Merriss et al. | 331/69 |

* cited by examiner

*Primary Examiner*—Arnold Kinkead
(74) *Attorney, Agent, or Firm*—Mark P. Bourgeois; Mark W. Borgman

(57) ABSTRACT

A temperature compensated crystal oscillator using an AT cut crystal produces a reference frequency. The temperature compensated crystal oscillator is located inside a temperature controlled oven. The temperature controlled oven provides a stable temperature to the temperature compensated crystal oscillator such that deviations from the reference frequency are reduced.

8 Claims, 2 Drawing Sheets

TEMPERATURE CONTROLLED COMPENSATED OSCILLATOR

CROSS REFERENCE TO CO-PENDING APPLICATIONS

This application is a continuation in part of U.S. patent application Ser. No. 09/335,245, filed Jul. 17, 1999 which is C-I-P of Ser. No. 08/961,689 Oct. 31, 1997 Abandoned and titled, "Temperature Compensation Circuit for a Crystal Oscillator". The foregoing patent has the same assignee as the instant application and is herein incorporated by reference in entirety.

BACKGROUND OF THE PREFERRED EMBODIMENT(S)

1. Field of the Preferred Embodiment(s)

This invention relates to oscillators which provide a stable reference frequency signal in computers or other electronic equipment. Specifically, there is a temperature compensated crystal oscillator that is contained within an ovenized enclosure to increase the stability of the reference frequency signal.

2. Description of the Related Art

Various devices are well known for providing a reference frequency or source such devices are called oscillators. The oscillator typically has a quartz crystal or other resonator and also has electronic compensation circuitry to stabilize the output frequency.

Various methods are known to stabilize the output frequency as the temperature of the oscillator changes. Temperature compensated crystal oscillators (TCXO's) typically employ a thermistor network to generate a correction voltage which reduces the frequency variation over temperature. The correction voltage is usually applied to a varactor diode in the crystal circuit such that the crystal frequency may be varied by a small amount. TCXO stability can approach 0.1 PPM but several problems must be addressed. A TCXO that resides at one temperature extreme for an extended period of time may exhibit a frequency shift when returned to normal room temperature. Usually this hysterisis or "retrace" error is temporary but a seemingly permanent offset is common. Retrace errors are usually less than about 0.1 PPM but can be much higher, especially if the mechanical tuning device (trimmer capacitor or potentiometer) is shifting. This hysterisis makes the manufacture of TCXOs with specifications approaching 0.1 PPM quite difficult. The high precision crystals found in oven oscillators exhibit less retrace but they are unsuitable for use in TCXOs because they often exhibit activity dips at temperatures below the designed oven temperature and SC-cuts and high overtone types cannot be tuned by a sufficient amount to compensate for the frequency excursion. In addition SC cut crystals are very expensive. TCXOs are preferred to oven oscillators in low power applications and when a warm-up period is not acceptable. The only warm-up time is the time required for the components to reach thermal equilibrium and the total current consumption can be very low - often determined by the output signal power requirements. Older TCXO designs employ from one to three thermistors to flatten the crystal temperature frequency curve. Newer designs employ digital logic or a microprocessor to derive a correction voltage from values or coefficients stored in memory.

Ovenized oscillators heat the temperature sensitive portions of the oscillator which is isolated from the ambient to a uniform temperature to obtain a more stable output. Ovenized oscillators contain a heater, a temperature sensor and circuitry to control the heater. The temperature control circuitry holds the crystal and critical circuitry at a precise, constant temperature. The best controllers are proportional, providing a steady heating current which changes with the ambient temperature to hold the oven at a precise set-point, usually about 10 degrees above the highest expected ambient temperature.

Temperature induced frequency variations can be greatly reduced by an amount approaching the thermal gain of the oven. The crystal for the oven is selected to have a "turning-point" at or near the oven temperature further reducing the sensitivity to temperature. The combination of the high oven gain with operation near turning point yields temperature stabilities as good as 0.0001 PPM over a temperature range that would cause the crystal to change by 10 PPM. Highly polished, high-Q crystals which often have significant activity dips may be designed with no activity dips near the operating temperature providing better stability and phase noise than crystals designed for wide temperature ranges. Ovenized oscillators allow the use of SC-cut crystals which offer superior characteristics but which are impractical for ordinary TCXOs because of their steep frequency drop at cooler temperatures. Unfortunately SC cut crystals are much more expensive to produce than AT cut crystals typically used in TCXO's. Oven oscillators have a higher power consumption than temperature compensated oscillators. Oven oscillators require a few minutes to warm-up and the power consumption is typically one or two watts at room temperature. SC-cut crystals stabilize as soon as they reach the operating temperature but AT-cut crystals exhibit a significant thermal transient effect which can take many minutes to settle. A typical AT-cut crystal will drop in frequency well below any point on the static crystal curve due to the sudden application of oven heat. The frequency will exponentially drift back up to the nominal frequency in most oscillators. In some designs the oven controller overshoots significantly during initial warm-up and then cools back down to the final oven temperature. This cooling transient can kick the AT-cut in the other direction and may actually result in a shorter warm-up time even though the controller takes longer to settle. Hand tweaked designs can achieve fairly good warm-up times with carefully selected overshoot but the advent of quick settling SC-cut crystals obsoleted this approach.

Despite the advantages of the prior art oscillators, an unmet need exists for an oscillator that has the high performance of an ovenized oscillator at the low cost of a temperature controlled crystal oscillator.

SUMMARY OF THE PREFERRED EMBODIMENT(S)

It is a feature of the invention to provide a low cost oscillator that has a stable reference source or frequency.

A further feature of the invention is to provide an oscillator assembly that has a temperature compensated crystal oscillator that produces a reference frequency. The temperature compensated crystal oscillator is located inside a temperature controlled oven. The temperature controlled oven provides a stable temperature to the temperature compensated crystal oscillator such that deviations from the reference frequency are reduced.

A further feature of the invention is to provide an oscillator assembly that includes a substrate and a temperature compensated crystal oscillator mounted on the substrate for producing a reference frequency. A temperature controller is mounted on the substrate. The substrate is located in a housing. The temperature controller provides a stable temperature to the temperature compensated crystal oscillator such that deviations from the reference frequency are reduced.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

BRIEF DESCRIPTION OF THE DRAWINGS

These and other features of the invention can best be understood by the following description of the accompanying drawings as follows.

It is noted that the drawings of the invention are not to scale. The invention will be described with additional specificity and detail through the accompanying drawings.

DETAILED DESCRIPTION OF THE PREFERRED EMBODIMENT

Figure 1:
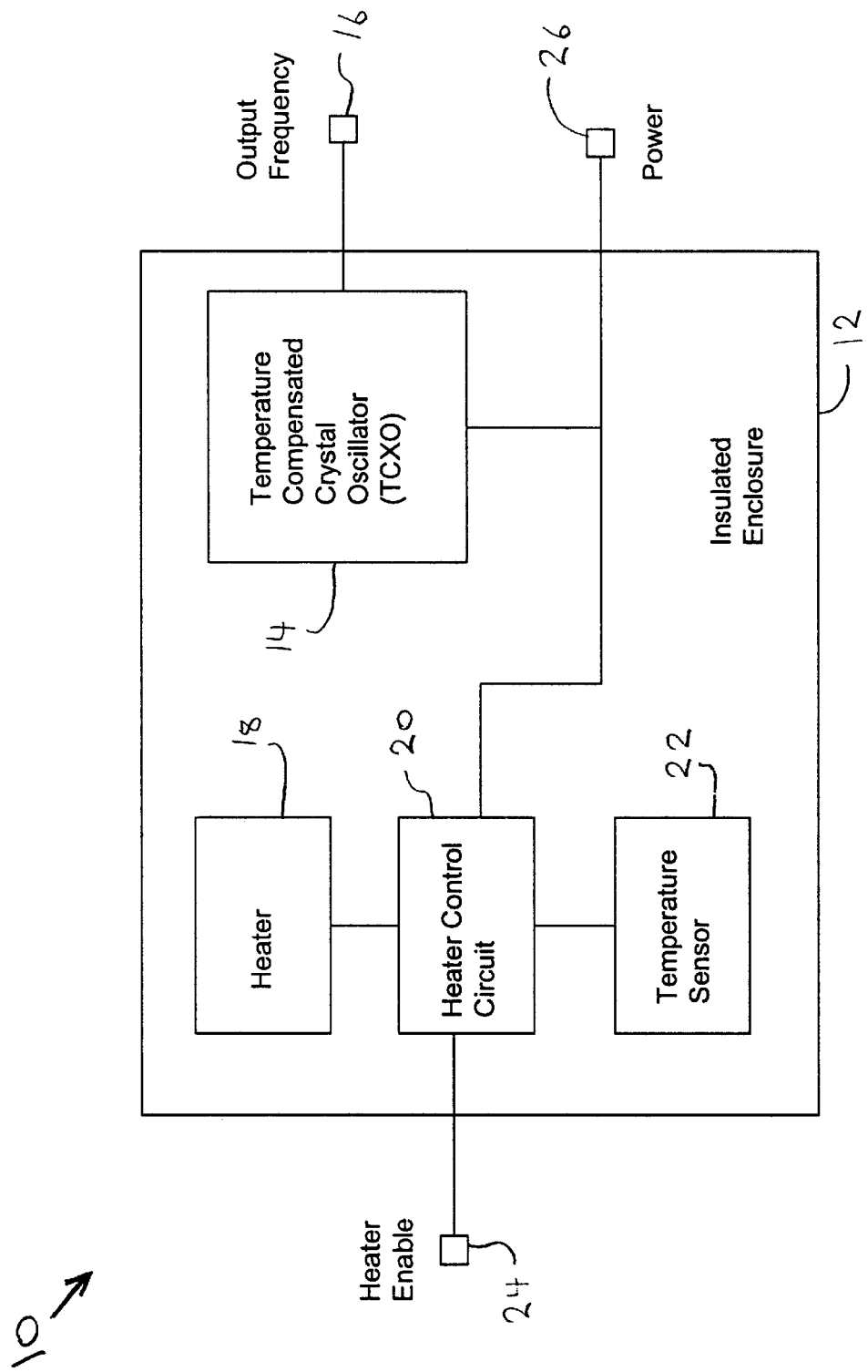
FIG. 1 is a diagrammatic view of the preferred embodiment of the invention.

Referring to FIG. 1, a diagrammatic view of a Temperature Controlled Compensated Oscillator is shown. Oscillator assembly 10 includes an insulated housing or oven 12, which contains the oscillator components. Oven 12 is a metal enclosure with foam insulation. A conventional temperature controlled crystal oscillator (TCXO) 14 is located in oven 12. TCXO 14 is preferably a Colpitts oscillator using an AT cut quartz crystal. TCXO 14 provides a stable reference frequency at output terminal 16.

A heater 18 is located in oven 12. Heater 18 is typically a transistor in which the dissipated power is proportionally controlled to heat and maintain a constant temperature inside oven 12. A temperature sensor 22 is located inside housing 12. Sensor 22 is a negative coefficient conventional thermistor. The temperature sensor monitors the temperature of TCXO 14. Connected to sensors 22 and heater 18 is a control circuit 20 which controls heater 18. Control circuit 20 receives a temperature signal as an input from sensor 22 and provides a heater control signal as an output. When the temperature is below the selected setpoint for the oven, control circuit 20 increased power to heater 18 to increase the temperature in oven 12. When the temperature is above the setpoint for the oven, control circuit 20 reduces power to heater 18 to allow a decrease in the temperature in oven 12.

Oscillator assembly 10 can be operated as a dual mode oscillator, depending on if the oven is operational. The oscillator can be operated as a regular temperature compensated oscillator without the oven, with low power consumption of about 50 mw and frequency stability of about 300 ppb. In this mode, TCXO 14 would be compensated to at temperatures over the entire temperature range. In the ovenized mode, TCXO 14 would be optimized for temperatures around the setpoint of the oven and have a frequency stability of about 20 ppb. In the ovenized mode about 1 watt of power is used.

Figure 2:
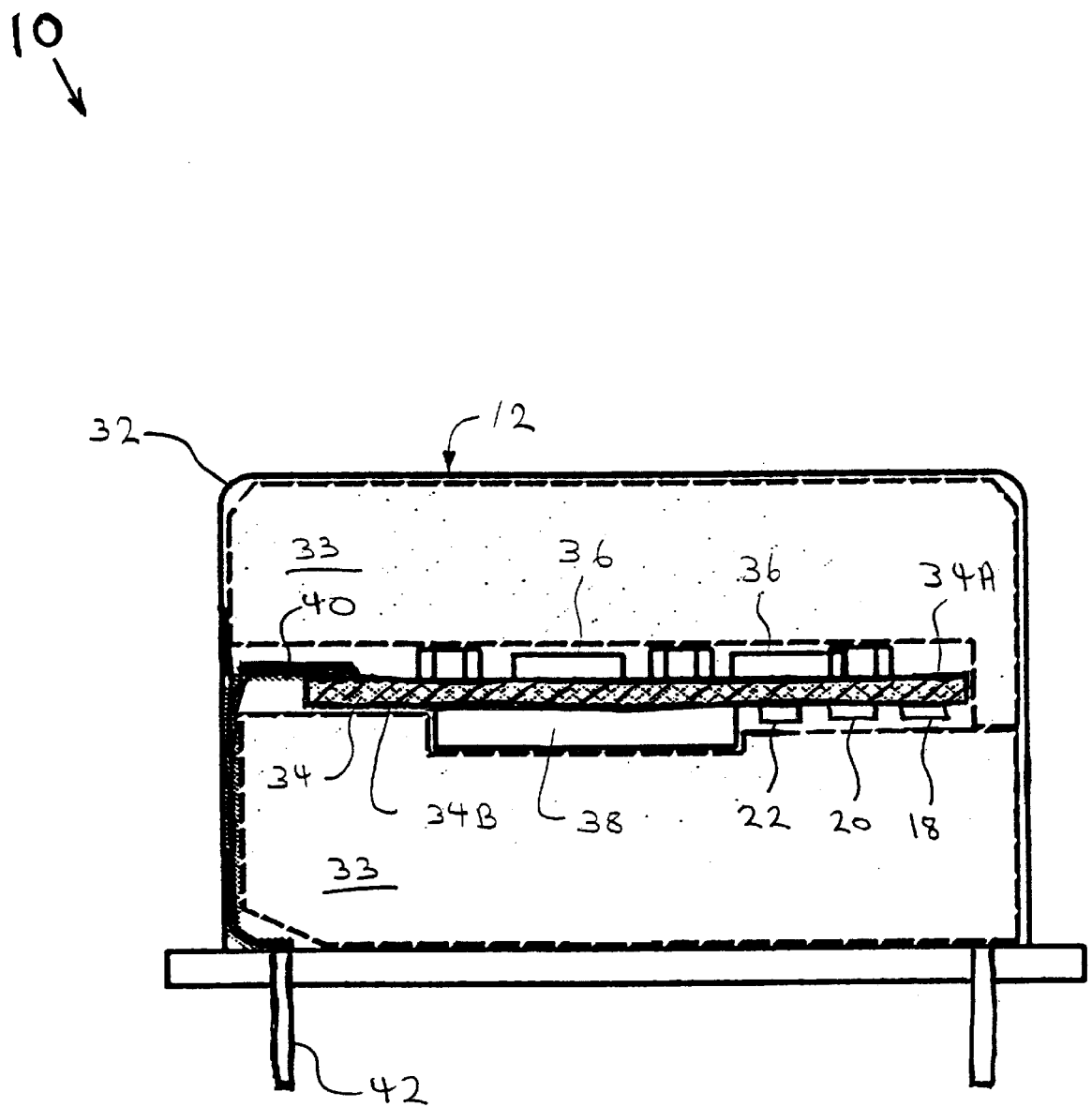
FIG. 2 is a cross-sectional view of a temperature controlled compensated oscillator.

FIG. 2 shows a cross-sectional view of a physical layout of a temperature controlled compensated oscillator. Oscillator assembly 10 has a housing or oven enclosure 12 that includes a hermetically sealed metal can 32 and a foam insulation 33. A substrate 34 is located inside oven 12. Substrate 34 can be ceramic or a printed circuit board. Mounted to substrate 34 is the temperature compensated crystal oscillator 14. TCXO 14 has oscillator and temperature compensation circuitry 36 mounted on side 34A of substrate 34. Temperature compensation circuitry 36 is preferably a voltage tuned thermistor network along with a Colpitts oscillator design that is described in detail in U.S. patent application Ser. No. 09/335,245 entitled, "Temperature Compensation Circuit for a Crystal Oscillator", herein incorporated by reference in entirety. An AT cut quartz crystal 38 is mounted on side 34B of substrate 34. Heater 18, temperature sensors 22 and control circuit 20 are mounted on side 34B. A flexible cable 40 connects circuit lines (not shown) on substrate 34 to output pins 42. Cable 40 carries the output signal, power lines and oven enable line.

The oven 12 controls the temperature of TCXO 14 to approximately plus or minus three to five degrees about the oven set point. This level of temperature control is not sufficient to achieve frequency stabilities on the order of 20 ppb with an AT cut crystal and a non-compensated oscillator in an oven. However, frequency stabilities on the order of 20 ppb are achieved with a temperature compensated crystal oscillator using an AT cut crystal mounted in an oven to control temperature within 3 to 5 degrees. Oscillator assembly 10 can be operated as a dual mode oscillator, depending on if the oven is operational. With the oven off, moderate frequency stability of about 200 ppb is provided with low power consumption. With the oven on, the temperature of the oven is stabilized and frequency stability improves to 20 ppb. The oven could be left off to conserve power and the oven turned on only when high frequency stability is needed. This type of oscillator could have numerous applications in areas such as space, remote sensing, military and telecommunications.

VARIATIONS OF THE PREFERRED EMBODIMENT(S)

One of ordinary skill in the art of oscillator design, will realize many advantages from using the preferred embodiment. Further, one of ordinary skill in the art of making oscillators will realize that there are many different ways of accomplishing the preferred embodiment. For example, it is contemplated to that heater 18 , control circuit 20 and temperature sensor 22 could be located outside the oven enclosure 12. Similarly, only the control circuit could be located outside oven 12. The embodiment showed the use of an AT cut crystal, other crystals and cuts could be used.

Even though, the embodiment discusses the use of a single heater 18, it is contemplated to use more than one heater.

Further, the crystal 38 could be an inverted mesa type crystal or a surface acoustical wave device or a rectangular strip type crystal or other materials.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description.

All changes that come within the meaning and range of equivalency of the claims are to be embraced within their scope.

What is claimed is:

1. A high stability oscillator assembly, comprising:
   a) a crystal oscillator mounted on a substrate and operable to produce a reference frequency;
   b) a temperature compensation circuit mounted on the substrate and in communication with the crystal oscillator, the temperature compensation circuit adapted to adjust the reference frequency in response to temperature changes of the crystal;
   c) an oven, the crystal oscillator and the temperature compensation circuit located inside the oven;
   d) a heater mounted on the substrate and located in the oven in proximity to the crystal oscillator;
   e) a temperature sensor mounted on the substrate and located in the oven in proximity to the crystal oscillator for sensing a temperature; and
   f) a temperature control circuit mounted on the substrate and located in the oven and in communication with the temperature sensor and the heater, the temperature control circuit controlling the heater in response to the sensed temperature such that a stable temperature is provided to the crystal oscillator; and
   g) the temperature compensation circuit and the temperature control circuit operating independently such that deviations from the reference are reduced.

2. The oscillator assembly according to claim 1, wherein the temperature sensor is a thermistor.

3. The oscillator assembly according to claim 2, wherein the crystal oscillator includes a crystal that is an AT cut crystal.

4. The oscillator assembly according to claim 3, wherein the crystal oscillator is a Colpitts oscillator.

5. An oscillator assembly, comprising:
   a) a crystal oscillator operable to produce a reference frequency, the oscillator mounted to a substrate;
   b) a first temperature control circuit in communication with the crystal oscillator and mounted to the substrate, the first temperature control circuit adapted to adjust the reference frequency in response to changes in temperature;
   c) an oven, the crystal oscillator, the substrate and the first temperature control circuit located inside the oven;
   d) a heater mounted to the substrate and located in the oven in proximity to the crystal oscillator;
   e) a temperature sensor mounted to the substrate and located in the oven in proximity to the crystal oscillator for sensing a temperature; and
   f) a second temperature control circuit mounted to the substrate and located in the oven and in communication with the temperature sensor and the heater, the second temperature control circuit controlling the heater in response to the sensed temperature, the first temperature control circuit and the second temperature control circuit operating independently.

6. An oscillator assembly, comprising:
   a) a substrate having a first side and a second side;
   b) a crystal mounted on the second side;
   c) an oscillator circuit mounted on the first side and electrically connected to the crystal, the crystal and the oscillator circuit adapted to provide a reference frequency;
   d) a temperature compensation circuit mounted on the first side and electrically connected to the oscillator circuit;
   e) a heater mounted to the second side;
   f) a temperature sensor mounted to the second side;
   g) a temperature control circuit mounted to the second side and electrically connected to the heater and the temperature sensor; and
   h) an insulated housing, the substrate located in the housing, the temperature control circuit providing a stable temperature within the housing, the temperature compensation circuit and the temperature control circuit adapted to minimize deviations from the reference frequency.

7. The oscillator assembly according to claim 6, wherein the temperature sensor is a thermistor.

8. The oscillator assembly according to claim 6, wherein the crystal is an AT cut crystal.

* * * * *